United States Patent
Katayama et al.

[11] Patent Number: 5,911,852
[45] Date of Patent: Jun. 15, 1999

[54] PLASMA PROCESSING APPARATUS

[75] Inventors: Katsuo Katayama, Amagasaki; Kyouichi Komachi, Kobe; Kouichi Iio, Amagasaki; Takeshi Akimoto, Tokyo, all of Japan

[73] Assignee: Sumitomo Metal Industries Limited, Osaka, Japan

[21] Appl. No.: 08/663,640

[22] Filed: Jun. 14, 1996

[30] Foreign Application Priority Data

Jun. 15, 1995 [JP] Japan .................... H7-148473
Dec. 15, 1995 [JP] Japan .................... H7-327637

[51] Int. Cl.⁶ .................................... C23F 1/08
[52] U.S. Cl. .................. 156/345; 118/723 MW; 118/723 ME
[58] Field of Search .............. 156/345; 118/723 MW, 118/723 ME

[56] References Cited

U.S. PATENT DOCUMENTS

| | | | |
|---|---|---|---|
| 5,074,985 | 12/1991 | Tamura et al. | 204/298.11 |
| 5,432,315 | 7/1995 | Kaji et al. | 219/121.43 |
| 5,487,875 | 1/1996 | Suzuki | 422/186.05 |
| 5,529,632 | 6/1996 | Katayama et al. | |
| 5,545,258 | 8/1996 | Katayama et al. | |

FOREIGN PATENT DOCUMENTS

| | | |
|---|---|---|
| 0 502 269 A1 | 9/1992 | European Pat. Off. . |
| 0 591 975 A1 | 4/1994 | European Pat. Off. . |
| 0 688 037 A1 | 12/1995 | European Pat. Off. . |
| 0 688 038 A2 | 12/1995 | European Pat. Off. . |
| 0 688 038 A3 | 12/1995 | European Pat. Off. . |
| 6-104098 | 4/1994 | Japan . |
| 7-161490 | 6/1995 | Japan . |

*Primary Examiner*—Donna C. Wortman
*Assistant Examiner*—Brenda G. Brumback
*Attorney, Agent, or Firm*—Barnes & Thornburg

[57] ABSTRACT

A plasma processing apparatus includes a conductive thin film provided on a surface of a microwave introducing member which is exposed to a processing chamber, in which an object to be processed is placed. The conductive thin film is provided at the entire portion excluding a transmission portion, through which microwaves pass into the processing chamber. The conductive thin film is grounded to act as an electrode.

17 Claims, 5 Drawing Sheets

PLASMA PROCESSING APPARATUS

TECHNICAL FIELD

The present invention relates to a plasma processing apparatus, and more particularly to a microwave-plasma processing apparatus for etching semiconductor wafers, or for forming thin films on the wafers.

BACKGROUND ART

In fabrication of highly integrated semiconductor devices, microwave-plasma processing apparatuses have been widely used. In such a microwave-plasma processing apparatus, reaction gases and microwaves are introduced into a vacuum chamber to generate gas-discharge, so that a plasma is produced in the chamber. The plasma is applied to a substrate to etch the surface thereof, or to form thin film layers thereon. Especially, in dry-etching technology and embedding technology, microwave-plasma processing apparatuses controlling generation of the plasma and acceleration of ions in the plasma independently have become important and been studied extensively.

Figure 1:
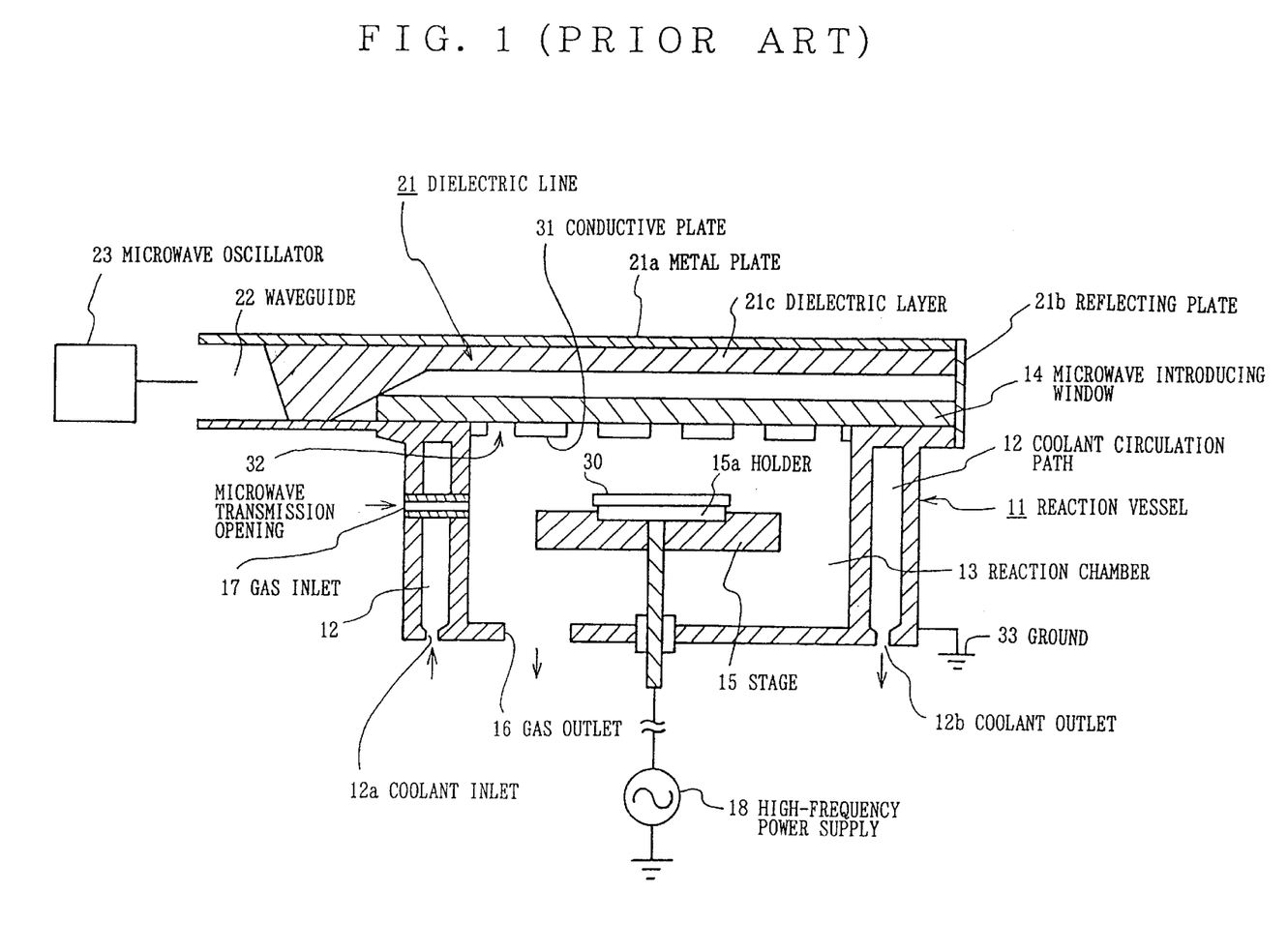
FIG. 1 is a cross-sectional view illustrating a conventional microwave-plasma processing apparatus.

FIG. 1 is a cross-sectional view illustrating a microwave-plasma processing apparatus disclosed in Japanese Patent Laying Open, Kokai Heisei 6-104098 filed by the common applicant to this application. The invention aimed to realize control of generation of a plasma and accelyration of ions in the plasma independently. In FIG. 1, a numeral reference "11" represents a reaction vessel, which is made of metal such as stainless steel, aluminum, or the like. The reaction vessel 11 has a periphery wall of double structure forming a coolant path 12. Along the coolant path 12, coolant circulates from a coolant inlet 12a to a coolant outlet 12b. A reaction chamber 13 is formed in the reaction vessel 11. The reaction vessel 11 is sealed at the top with a microwave introducing window 14, which is made of dielectric material, such as quartz glass, Pyrex glass, alumina, etc., having a low dielectric loss and heat resistance. For heating the interior of the reaction chamber 13, an electric heater, not shown in FIG. 1, is provided around the reaction vessel 11. Both by heating with the electric heater and cooling with the coolant circulating in the coolant path 12, the inside the reaction chamber 13 is controlled in temperature precisely.

The microwave introducing window 14 is provided on the lower surface with a conductive plate 31 of metal acting as a grounded electrode. The conductive plate 31 is provided with a plurality of microwave transmission openings 32, arranged perpendicularly to the direction of traveling of microwaves. The conductive plate 31 is grounded (33) through the reaction vessel 11. The conductive plate 31 may be placed in the middle between the microwave introducing window 14 and an object holder 15a, while the conductive plate 31 is grounded (33) through the reaction vessel 11, although the arrangement is not shown.

In the reaction chamber 13, the object holder 15a holding an object 30 to be processed is placed on a stage 15, which moves up and down by a driver (not shown). The object holder 15a is connected to a high-frequency power supply 18 to generate bias voltage on the surface of the object 30. The object holder 15a is provided with a chucking mechanism (not shown), such as an electrostatic chuck to hold the object 30 firmly. The object holder 15a is also provided with a cooling mechanism (not shown) in which coolant circulates for cooling the object 30. On the bottom of the reaction vessel 11, a gas outlet 16 connected to an exhaust apparatus (not shown) is formed. On the side wall of the reaction vessel 11, a gas inlet 17 is formed to introduce predetermined reaction gas into the reaction chamber 13.

Over the reaction vessel 11, a dielectric line 21, composed of a metal plate 21a of aluminum, or the like, and a dielectric layer 21c, is provided. The end of the dielectric line 21 is sealed with a reflecting plate 21b of metal. The dielectric layer 21c is attached on the lower surface of the metal plate 21a. The dielectric layer 21c is made of fluorine resin, polyethylene, polystyrene, or the like, having a low dielectric loss. The dielectric line 21 is connected through a waveguide 22 to a microwave oscillator 23, so that microwaves generated by the microwave oscillator 23 travel through the waveguide 22 into the dielectric line 21.

In the above mentioned microwave-plasma processing apparatus, for etching the surface of the object 30 held by the object holder 15a, the position of the stage 15 is adjusted in height so that the object 30 is placed at the appropriate position. Next, unnecessary gases are discharged from the reaction chamber 13 through the gas outlet 16, then the reaction gas is introduced from the gas inlet 17 into the reaction chamber 13 until the pressure thereof reaches a predetermined level. At the same time, the coolant is introduced from the coolant inlet 12a into the coolant path 12, and is discharged from the coolant outlet 12b. Subsequently, microwaves generated by the microwave oscillator 23 travels along the waveguide 22 to the dielectric line 21. When the microwaves are introduced in the dielectric line 21, electromagnetic field is generated under the dielectric line 21, and the microwaves pass through the microwave transmission openings 32 into the reaction chamber 13. In response to the microwaves, a plasma is generated in the reaction chamber 13. After that, when high-frequency voltage is applied from the high-frequency power supply 18 to the object holder 15a, bias voltage is generated on the surface of the object 30. With the stable bias voltage, ions in the plasma are irradiated vertically to the surface of the object 30 to be etched, while the energy of the ions is controlled.

In the microwave-plasma processing apparatus, the grounded potential is stable relative to the plasma, because the conductive plate 31 with the microwave transmission openings 32 are contacted on the microwave introducing window 14. As a result, the plasma potential becomes stable in the reaction chamber 13, and therefore, the stable bias voltage can be applied to the surface of the object 30 uniformly. Consequently, ion energy in the plasma can be well controlled, and the ions can be irradiated to the surface of the object vertically.

According to the conventional microwave-plasma processing apparatus, however, the microwave introducing window 14 expands with the passage of time, when the apparatus keeps operating for a long time, so that an undesirable gap is formed between the conductive plate 31 and the microwave introducing window 14 because of a difference of thermal coefficient of expansion between them. As a result, undesirable electrical discharge may occur within the gap, and it becomes difficult to generate stable bias voltage on the object 30.

There is another disadvantage in that the microwave introducing window 14 is eroded with plasma, because the microwave introducing window 14 is directly applied with plasma. Especially, the microwave introducing window 14 made of quartz glass, or the like is easily eroded with the halogen series of gas plasma, such as chlorine, fluorine and bromine. As a result, the microwave introducing window 14 is changed in width with the passage of time. Therefore, the density and distribution of plasma changes, and it becomes difficult to carry out plasma processing uniformly and stably.

OBJECTS OF THE INVENTION

Accordingly, an object of the invention is to provide a plasma processing apparatus in which generation of undesirable electrical discharge can be avoided, so that stable bias voltage is uniformly applied to the surface of an object to be processed.

Another object of the invention is to provide a plasma processing apparatus in which a microwave introducing window is protected from erosion.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a plasma processing apparatus includes a conductive thin film provided on a surface of a microwave introducing member which is exposed to a processing chamber, in which an object to be processed is placed. The conductive thin film is provided at the entire portion excluding a transmission portion, through which microwaves pass into the processing chamber. The conductive thin film is grounded to act as an electrode. In the apparatus, the conductive thin film is preferably be formed on the microwave introducing member by plasma sputtering technique. The conductive thin film may be mainly made of material selected from SiC, Si, C and Al to have a thickness of 10 $\mu$m to 100 $\mu$m.

According to a second aspect of the invention, a plasma processing apparatus includes an insulation thin film provided on a surface of a microwave introducing member which is exposed to a processing chamber, in which an object to be processed is placed; and a conductive thin film provided on the entire surface of the microwave introducing member, excluding a transmission portion. The conductive thin film is grounded to act as an electrode. In the apparatus, preferably, the insulation thin film is mainly made of inorganic oxide material or inorganic nitride material to have a thickness of 10 $\mu$m to 100 $\mu$m by plasma sputtering technique. The conductive thin film may be provided on the insulation thin film. The insulation thin film may be provided only at the transmission portion. The insulation thin film is provided at the transmission portion and over the conductive thin film.

DETAILED DISCLOSURE OF THE INVENTION

Figure 2:
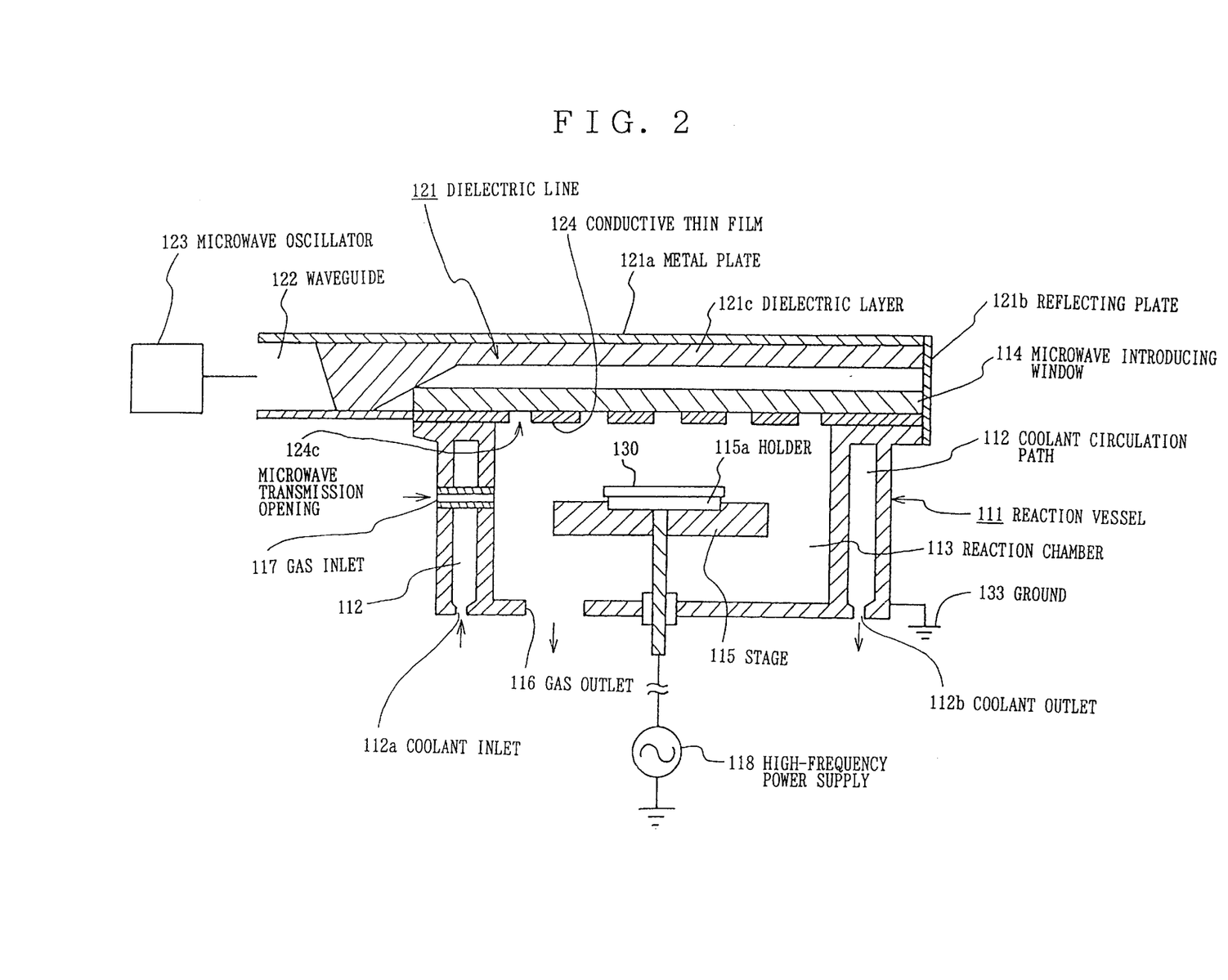
FIG. 2 is a cross-sectional view illustrating a microwave-plasma processing apparatus of a first preferred embodiment according to the invention.

FIG. 2 is a cross-sectional view illustrating a microwave-plasma processing apparatus of a first preferred embodiment according to the invention. In FIG. 2, a numeral reference "111" represents a reaction vessel, which is made of metal such as stainless steel, aluminum, or the like. The reaction vessel 111 has a periphery wall of double structure forming a coolant path 112. Along the coolant path 112, coolant circulates from a coolant inlet 112a to a coolant outlet 112b. A reaction chamber 113 is formed in the reaction vessel 111. The reaction vessel 111 is sealed at the top with a microwave introducing window 114, which is made of dielectric material, such as quartz glass, Pyrex glass, alumina, etc., having a low dielectric loss and heat resistance. For heating the interior of the reaction chamber 113, an electric heater, not shown in FIG. 2, is provided around the reaction vessel 111. Both by heating with the electric heater and cooling with the coolant circulating in the coolant path 112, the inside the reaction chamber 113 is controlled in temperature precisely.

The microwave introducing window 114 is selectively provided on the lower surface with a conductive thin film 124 functioning as a grounded electrode. The conductive thin film 124 is provided with a plurality of microwave transmission openings 124c, arranged perpendicularly to the direction of traveling of microwaves. The conductive thin film 124 is grounded (133) through the reaction vessel 111.

In the reaction chamber 113, the object holder 115a holding an object 130 to be processed is placed on a stage 115. The stage 115 is designed so as to move up and down by a driver (not shown). The object holder 115a is connected to a high-frequency power supply 118 to generate bias voltage on the surface of the object 130. The object holder 15a is provided at the top with a chucking mechanism (not shown), such as an electrostatic chuck to hold the object 130 firmly. The object holder 115a is also provided with a cooling mechanism (not shown) in which coolant circulates for cooling the object 130. On the bottom of the reaction vessel 111, a gas outlet 116 connected to an exhaust apparatus (not shown) is provided. On the side wall of the reaction vessel 111, a gas inlet 117 is formed to introduce predetermined reaction gas into the reaction chamber 113.

Over the reaction vessel 111, a dielectric line 121, composed of a metal plate 121a of aluminum, or the like, and a dielectric layer 121c, is provided. The end of the dielectric line 121 is sealed with a reflecting plate 121b of metal. The dielectric layer 121c is attached on the lower surface of the metal plate 1211a. The dielectric layer 121c is made of fluorine resin, polyethylene, polystyrene, or the like, having a low dielectric loss. The dielectric line 121 is connected through a waveguide 122 to a microwave oscillator 123, so that microwaves generated by the microwave oscillator 123 travel through the waveguide 122 to the dielectric line 121.

In the above mentioned microwave-plasma processing apparatus, for etching the surface of the object 130 held by the object holder 115a, the position of the stage 115 is adjusted in height so that the object 130 is placed at the appropriate position. Next, unnecessary gases are discharged from the reaction chamber 113 through the gas outlet 116, then the reaction gas is introduced from the gas inlet 117 into the reaction chamber 113 until the pressure thereof reaches a predetermined level. At the same time, the coolant is introduced from the coolant inlet 112a into the coolant path 112, and is discharged from the coolant outlet 112b. Subsequently, microwaves generated by the microwave oscillator 123 travel along the waveguide 122 to the dielectric line 121. When the microwaves are introduced in the dielectric line 121, electromagnetic field is generated under the dielectric line 121, and the microwaves pass through the microwave transmission openings 124c into the reaction chamber 113. In response to the microwaves, a plasma is generated in the reaction chamber 113. After that, when high-frequency voltage is applied from the high-frequency power supply 118 to the object holder 115a, the bias voltage is generated on the surface of the object 130. With the stable bias voltage, ions in the plasma are irradiated vertically to the surface of the object 130, while the energy of the ions is controlled. The object 130 is etched with the plasma in the reaction chamber 113.

Figure 3:
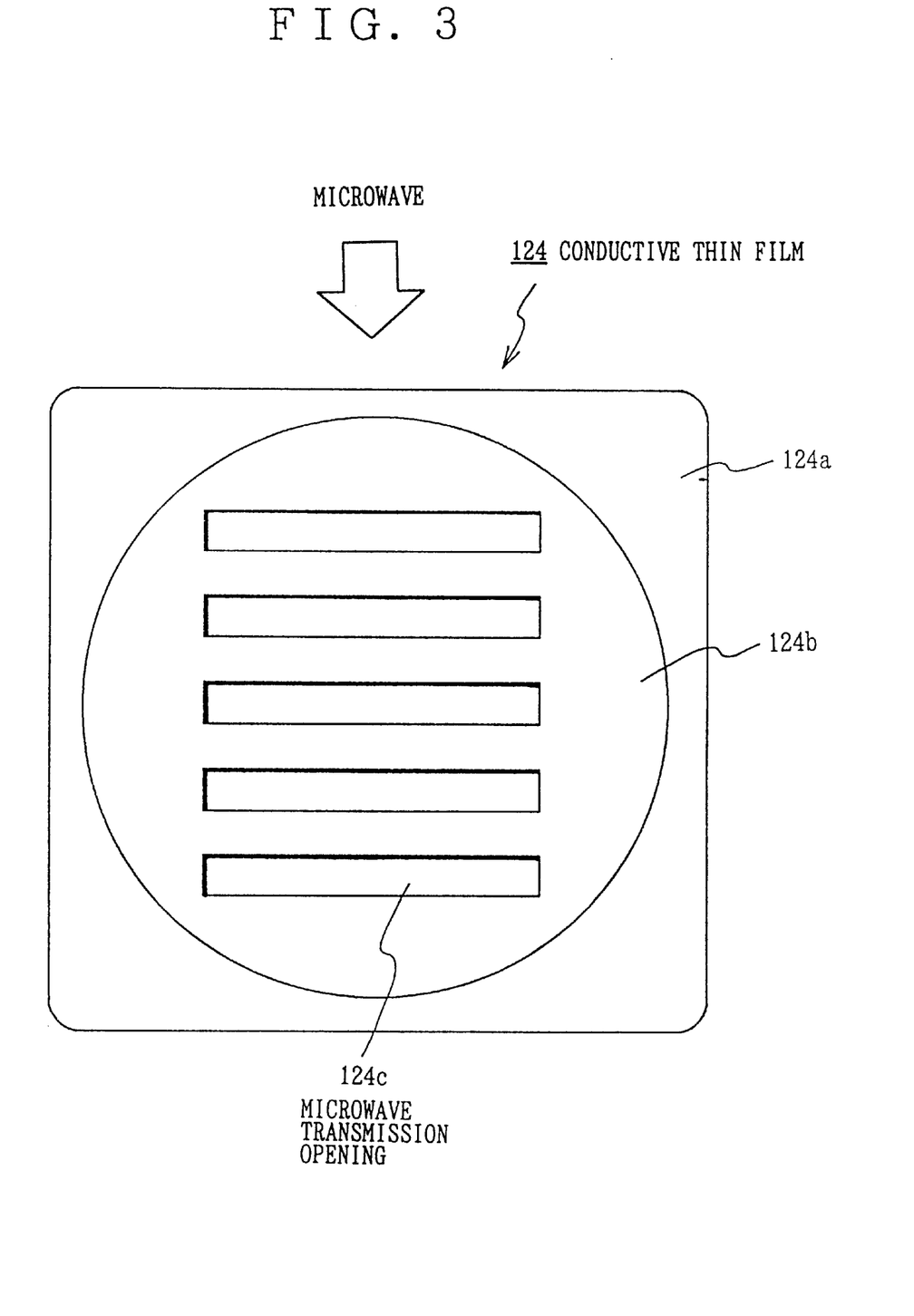
FIG. 3 is a plan view showing a conductive thin film used in the first preferred embodiment shown in FIG. 2.

Next, the detail of the microwave introducing window 114 with the conductive thin film 124 is now described in conjunction with FIG. 3. The conductive thin film 124 is entirely formed on the lower surface of the microwave introducing window 114 excluding the microwave transmission openings 124c by plasma sputtering technique. In FIG. 3, a numeral reference "124a" represents a contact portion being in contact with the reaction vessel 111, and "124b" represents a portion corresponding to the upper opening of the reaction chamber 113. The microwaves pass through the microwave transmission openings 124c into the reaction chamber 113. The conductive thin film 124 is electrically in contact with the reaction vessel 111 which is grounded, so that the conductive thin film 124 functions as a grounded electrode. For forming the conductive thin film 124, the portion corresponding to the openings 124c are covered with a masking tape.

Preferably, the conductive thin film 124 is made of material having conductivity and high corrosion resistance to the halogen series of gas plasma, and not producing contaminants. For instance, SiC, Si, C, Al or a kind of material having a thin oxidized layer, such as aluminum covered on the surface with an alumite layer. For heat resistance and plasma resistance characteristics and the cost of fabrication, the conductive thin film 124 is preferably formed to have a thickness of 10 to 100 µm. If the thickness of the film 124 is less than 10 µm, the thin film 124 has inferior heat resistance and inferior plasma resistance. On the other hand, if the thickness of the conductive thin film 124 is more than 100 µm, the cost of formation thereof becomes high and the thin film 124 has low density, causing cracking and peeling thereof.

Although the microwave transmission openings 124c are not limited in shape, those are preferably shaped into rectangular slits as shown in FIG. 3.

For forming the conductive thin film 124 on the lower surface of the microwave introducing window 114, besides plasma sputtering technique described above, CVD (Chemical Vapor Deposition) technique, other types of sputtering technique, LTAVD (Low Temperature Arc Vapor Deposition) coating technique are applicable. In those variety kinds of technique, sputtering technique is preferable, and any kinds of sputtering technique are applicable.

Thus formed conductive thin film 124 has characteristics of a low p.p.b. level of impurity; high corrosion resistance; high strength; high density; high heat resistance; high degree of adhesion to the microwave introducing window 114; high applicability of being coated on complicated shape of products; high applicability of changing the thickness; high crystal directivity for crystal metal, etc. Therefore, the conductive thin film 124 of the invention are suited for covering the microwave introducing window 114.

Second to fifth preferred embodiments of the invention are now described in conjunction with the appended drawings. In the second to fifth preferred embodiment, a microwave introducing window 114 is provided on the lower surface facing the object holder 115a with a conductive thin film (134, 144, 154, 164) and an insulation thin film (125, 135, 155, 165). The combination of the conductive thin film and the insulation thin film is different from each other among the second to fifth preferred embodiments.

Figure 4A:
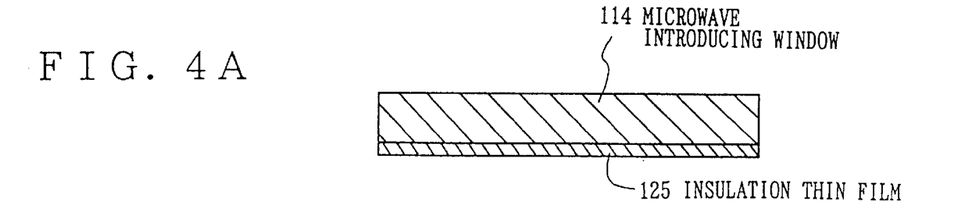
FIGS. 4A and 4B are cross-sectional views showing fabrication steps of a microwave introducing window with insulation thin film and conductive thin film, according to a second preferred embodiment of the invention.
Figure 4B:
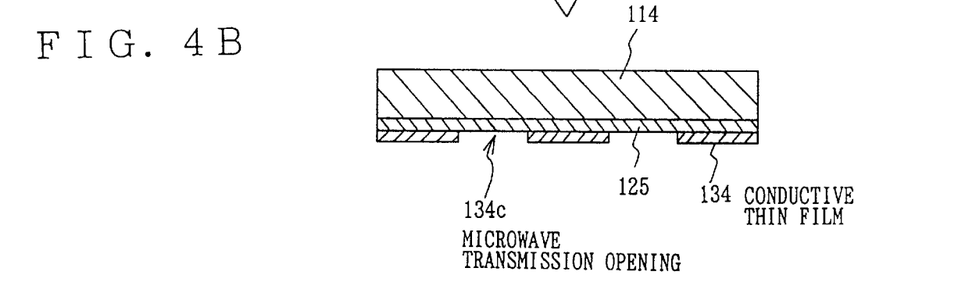

First, a microwave-plasma processing apparatus of the second preferred embodiment is described. FIGS. 4A and 4B are enlarged cross-sectional views illustrating the fabrication steps of a microwave introducing window 114 employed in a microwave-plasma processing apparatus of the second preferred embodiment. In FIGS. 4A and 4B, only the microwave introducing window 114 is partly shown, because the other components of the apparatus are the same as those in the first preferred embodiment.

In fabrication, first of all, an insulation thin film 125 is formed entirely on the lower surface of the microwave introducing window 114 facing the object holder 115a, as shown in FIG. 4A.

The insulation thin film 125 is preferably made of material having high corrosion resistance and not contaminating easily. For instance, inorganic oxide material such as alumina ($Al_2O_3$) and yttrium ($Y_2O_5$), and inorganic nitride material such as silicon nitride (SiN) and boron nitride (BN) are applicable. The insulation thin film 125 can be formed in the same manner as the conductive thin film 124 shown in FIGS. 2 and 3. The insulation thin film 125 is preferably formed to have a thickness of 10 to 100 µm. If the thickness of the insulation thin film 125 is less than 10 µm, the thin film 125 has inferior heat resistance and inferior plasma resistance. On the other hand, if the thickness of the insulation thin film 125 is more than 100 µm, the cost of formation of the thin film 125 becomes high and the film 125 has low density, causing cracking and peeling thereof. Thus formed insulation thin film 125 has the same advantageous characteristics as the above mentioned conductive thin film 124.

Next, as shown in FIG. 4B, a conductive thin film 134 is formed on the insulation thin film 125 in the same manner as that in the first preferred embodiment. The conductive thin film 134 has the same thickness and shape as those of the conductive thin film 124 of the first preferred embodiment.

Accordingly, it can be thought that the insulation thin film 125 is formed throughout on the lower surface of the microwave introducing window 114, and the conductive thin film 134 is selectively formed on the insulation thin film 125 having the same shape as the conductive thin film 124 shown in FIG. 3. As a result, microwaves pass through the portion, where the insulation thin film 125 is only formed, into the reaction chamber 113.

Figure 5A:
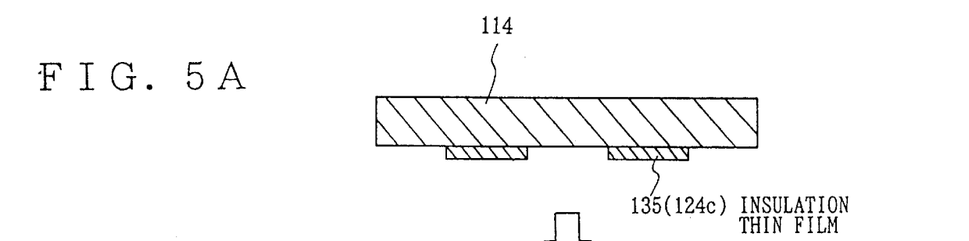
FIGS. 5A and 5B are cross-sectional views showing fabrication steps of a microwave introducing window with insulation thin film and conductive thin film, according to a third preferred embodiment of the invention.
Figure 5B:
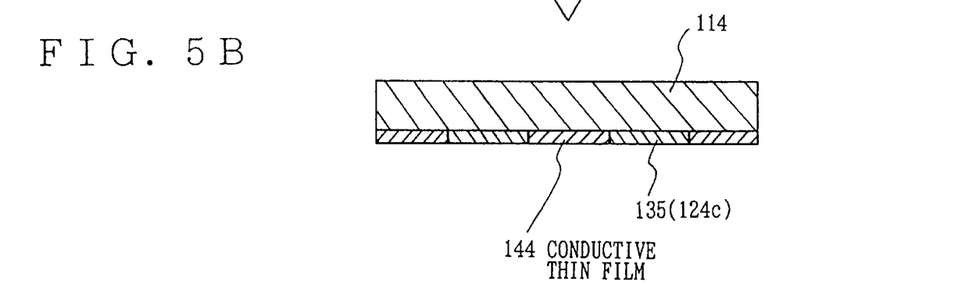

Next, a microwave-plasma processing apparatus of the third preferred embodiment is described. FIGS. 5A and 5B are enlarged cross-sectional views illustrating the fabrication steps of a microwave introducing window 114 employed in a microwave-plasma processing apparatus of the third preferred embodiment. In FIGS. 5A and 5B, only the microwave introducing window 114 is partly shown, because the other components of the apparatus are the same as those in the first preferred embodiment.

As shown in FIG. 5A, an insulation thin film 135 is formed selectively on the lower surface of the microwave introducing window 114. Then, a conductive thin film 144 is formed at the remaining portion on the microwave introducing window 114. The portion at which the insulation thin film 135 is formed becomes the microwave transmission openings 124c shown in FIG. 3. In practical fabrication, the lower surface of the microwave introducing window 114 excluding the microwave transmission openings 124c is covered with a masking tape, then the insulation thin film 135 is formed by sputtering technique at the portion for the microwave transmission openings 124c. Next, the insulation thin film 135 is covered with a masking tape, then the conductive thin film 144 is formed at the remaining portion. The insulation thin film 135 and conductive thin film 144 are preferably formed to have the same thickness.

As described above, according to the third preferred embodiment, the insulation thin film 135 is formed only on the portion for the microwave transmission openings 124c, and the conductive thin film 144 is formed on the remaining portion on the lower surface of the microwave introducing window 114. As a result, microwaves pass through the microwave transmission openings 124c, on which the insulation thin film 135 is formed, into the reaction chamber 113.

Figure 6A:
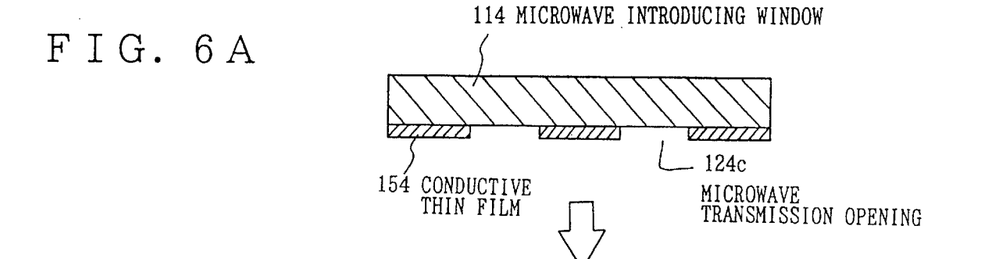
FIGS. 6A and 6B are cross-sectional views showing fabrication steps of a microwave introducing window with insulation thin film and conductive thin film, according to a fourth preferred embodiment of the invention.
Figure 6B:
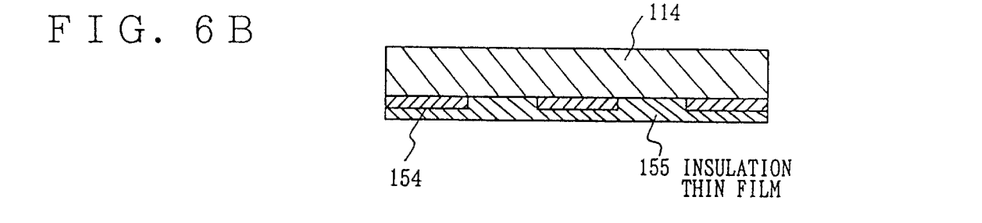

Next, a microwave-plasma processing apparatus of the fourth preferred embodiment is described. FIGS. 6A and 6B are enlarged cross-sectional views illustrating the fabrication steps of a microwave introducing window 114 employed in a microwave-plasma processing apparatus of the fourth preferred embodiment. In FIGS. 6A and 6B, only the microwave introducing window 114 is partly shown, because the other components of the apparatus are the same as those in the first preferred embodiment.

As shown in FIG. 6A, a conductive thin film 154 is selectively formed on the lower surface of the microwave introducing window 114 in the same manner as the first preferred embodiment. Then, an insulation thin film 155 is formed over the entire surface, corresponding to the upper opening (124b in FIG. 3) of the microwave introducing window 114, including the portion for the microwave transmission openings 124c. For forming the insulation thin film 155, the conductive thin film 154 is first covered with a masking tape, then the insulation thin film 155 is formed at the portion for the microwave transmission openings 124c to have the same thickness as the conductive thin film 154. After that, the masking tape on the opening 124b is removed, and the insulation thin film 155 is formed again on the entire surface. The insulation thin film 155, however, is not formed on the contact portion 124a, shown in FIG. 3, because the portion 124a is to be grounded though the reaction vessel 111.

As described above, at the contact portion 124a on the lower surface of the microwave introducing window 114, the conductive thin film 154 is only formed. The insulation thin film 155 is formed on the conductive thin film 154 and on the portion for the microwave transmission openings 124c to have a flat surface. The thickness of the insulation thin film 155 is preferably 20 to 200 μm.

The contact portion 124a is provided at the surface only with the conductive thin film 154, so that the conductive thin film 154 is grounded through the reaction vessel 111. On the other hand, the microwave transmission openings 124c are provided at the inside only with the insulation thin film 155, so that microwaves pass through them into the reaction chamber 113.

Figure 7A:
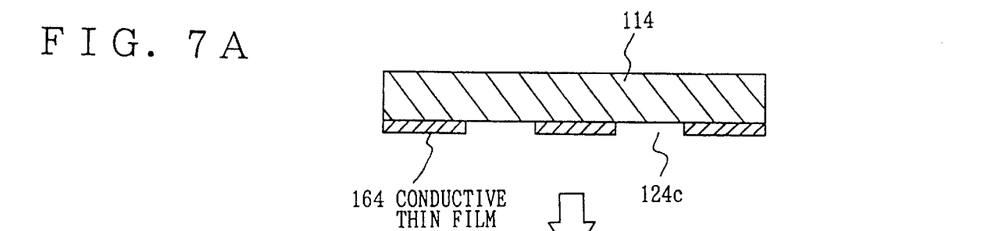
FIGS. 7A and 7B are cross-sectional views showing fabrication steps of a microwave introducing window with insulation thin film and conductive thin film, according to a fifth preferred embodiment of the invention.
Figure 7B:
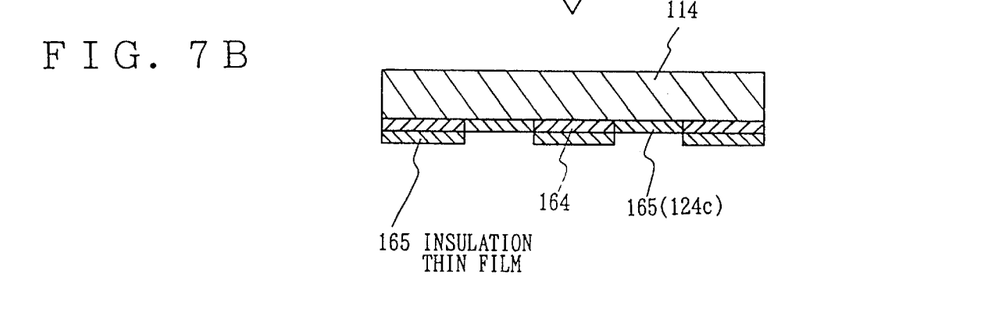

Next, a microwave-plasma processing apparatus of the fifth preferred embodiment is described. FIGS. 7A and 7B are enlarged cross-sectional views illustrating the fabrication steps of a microwave introducing window 114 employed in a microwave-plasma processing apparatus of the fifth preferred embodiment. In FIGS. 7A and 7B, only the microwave introducing window 114 is partly shown, because the other components of the apparatus are the same as those in the first preferred embodiment.

As shown in FIG. 7A, a conductive thin film 164 is selectively formed on the lower surface of the microwave introducing window 114 in the same manner as the first preferred embodiment. Then, an insulation thin film 165 is formed over the entire surface, corresponding to the upper opening of the microwave introducing window 114 (shown as the portion "124b" in FIG. 3), including the portion for the microwave transmission openings 124c. For forming the insulation thin film 165, the conductive thin film 164 is first covered with a masking tape, then the insulation thin film 165 is formed at the portion for the microwave transmission openings 124c to have the same thickness as the conductive thin film 164. After that, the masking tape on the opening 124b is removed, and the portion for the microwave transmission openings 124c are covered with a masking tape, then the insulation thin film 165 is again formed as shown in FIG. 7B.

For fabrication of the microwave introducing window 114 of the fifth preferred embodiment, another method is applicable. According to the other method, the conductive thin film 164 is formed in the same manner as the first preferred embodiment, as shown in FIG. 7A, then the insulation thin film 165 is formed on the upper opening 124b of the microwave introducing window 114 including the portion for the microwave transmission openings 124c. For forming the insulation thin film 165, the contact portion 124a is covered with masking tape, then the insulation thin film 165 is formed on the upper opening 124b and the microwave transmission openings 124c simultaneously.

As described above, at the contact portion 124a on the lower surface of the microwave introducing window 114, the conductive thin film 164 is only formed. The insulation thin film 165 is formed on the conductive thin film 164 formed on the upper opening 124a excluding the microwave transmission openings 124c, and on the portion for the microwave transmission openings 124c. The thicknesses of the thin films are different between the portion on which only the insulation thin film 165 is formed and the portion on which both the conductive thin film 164 and the insulation thin film 165 are formed. In other words, the insulation thin film 165 at the microwave transmission openings 124c has the same thickness as the conductive thin film 164. On the conductive thin film 164, the additional insulation thin film 165 is formed to have a thickness of 10 to 100 μm.

The contact portion 124a is provided only with the conductive thin film 164, so that the conductive thin film 164 is grounded through the reaction vessel 111. On the other hand, the microwave transmission openings 124c are provided at the inside only with the insulation thin film 165, so that microwaves pass through them into the reaction chamber 113.

TEST OF PERFORMANCE

Next, experimental data for the present invention will be described.

TEST 1

Test 1 was carried out for the microwave-plasma processing apparatus of the first preferred embodiment shown in FIGS. 2 and 3. In test 1, the conductive thin film 124 is formed by plasma sputtering technique with target material of aluminum in an atmosphere of Ar gas to have a thickness of 50 μm, and each of the microwave transmission openings 124c is shaped to be a rectangle of 200 mm×30 mm. A mean value of etching speed of a $SiO_2$ layer is examined. The etching process is performed pursuant to the conditions as follows:

Object (130): 8" Silicon Wafer with 1 μm of $SiO_2$ layer

Discharge Gas Mixture:
  $CF_4$ of 30sccm
  $CHF_3$ of 30sccm
  Ar of 100 sccm

Pressure in Reaction Chamber (113): 30 mTorr

Microwave Frequency: 2.45 GHz

Power for generating Plasma: 1 kW

High-frequency (RF) to Holder 115a, Frequency: 400 kHz, Power: 600 W

Number of Wafers to be tested: 10

Time for Etching: 1 minute

According to the test 1, a mean value of etching speed of the $SiO_2$ layers is 600 nm/minute, and a uniformity of the etching speed of the tested silicon wafers is ±5%.

After 500 pieces of silicon wafers are etched in the same condition, etching speed and its uniformity is examined to the last ten wafers. As a result, a mean value of etching speed is 590 nm/minute and a uniformity of the etching speed is ±5%.

TEST 2

Test 2 was carried out for the microwave-plasma processing apparatus of the fourth preferred embodiment shown in FIGS. 6A and 6B. In test 2, the conductive thin film 154 of aluminum is formed in the same manner as Test 1to have a thickness of 50 μm. The insulation thin film 155 is formed by plasma sputtering technique with target material of $Al_2O_3$ in an atmosphere of Ar gas to have a thickness of 50 μm. Each of the microwave transmission openings 124c is shaped to be a rectangle of 200 mm×30 mm. A mean value of etching speed of a $SiO_2$ layer is examined. The etching process is performed pursuant to the conditions as follows:

Object (130): 8" Silicon Wafer with 1 μm of $SiO_2$ layer

Discharge Gas Mixture:
  $CF_4$ of 30 sccm
  $CHF_3$ of 30 sccm
  Ar of 100 sccm Pressure in Reaction Chamber (113): 30 mTorr Microwave Frequency: 2.45 GHz Power for generating Plasma: 1 kW High-frequency (RF) to Holder 115a, Frequency: 400 kHz, Power: 600 W Number of Wafers to be tested: 10

Time for Etching: 1 minute

According to Test 2, a mean value of etching speed of the $SiO_2$ layers is 680 nm/minute, and a uniformity of the etching speed of the tested silicon wafers is ±5%.

After 500 pieces of silicon wafers are etched in the same condition, etching speed and its uniformity is examined to the last ten wafers. As a result, a mean value of etching speed is 570 nm/minute and a uniformity of the etching speed is ±5%.

TEST FOR REFERENCE

For reference, another test using the conventional plasma processing apparatus shown in FIG. 1 is performed. As described above, the conventional apparatus includes the same components as the apparatus of the invention shown in FIG. 2 except that the microwave introducing window 14 is provided with the conductive plate 31. The conductive plate 31 is not attached on the microwave introducing window 14, but contacted on it. The test is performed in the same condition of Test 1. As a result of the test, a mean value of etching speed of the $SiO_2$ layers is 600 nm/minute, and a uniformity of the etching speed of the tested silicon wafers is ±5%. When the more wafers are etched, however, an undesirable gap is formed between the conductive plate 31 and the microwave introducing window 14. As a result, it becomes difficult to generate stable bias voltage on the object 30 (silicon wafer) to be etched. After 500 pieces of silicon wafers are etched in the same condition, a mean value of etching speed becomes 550 nm/minute and a uniformity of the etching speed becomes ±12%. This result means that the etching speed is decreased and the uniformity of the etching speed becomes worse.

As described before, in the microwave-plasma processing apparatus tested in Test 1, the microwave introducing window 114 is covered on the lower surface with the conductive thin film 124, so that it can be prevented that a gap is formed between the microwave introducing window 114 and the conductive thin film 114 (electrode), even if the apparatus operates long. In addition, the conductive thin film 124 is grounded, and the object holder 115a is applied with high-frequency voltage. As a result, no undesirable electric discharge occurs in the reaction chamber 113, and therefore, stable bias voltage can be applied to the surface of the object 130. Consequently, as understood from the results of the tests, the objects such as silicon wafers can be uniformly etched at a stable speed for a long time.

In the microwave-plasma processing apparatus tested in Test 2, the microwave introducing window 114 is covered at the opening portion (124b) with the insulation thin film 155 entirely including the portion on which the conductive thin film 154 is formed. In addition, the conductive thin film 154 is grounded, and the object holder 115a is applied with high-frequency voltage. In addition to the advantage of the first preferred embodiment, therefore, there is an advantage in that the microwave introducing window 114 is not eroded with plasma. That is, the objects such as silicon wafers can be uniformly etched at a stable speed for a long time.

Although the invention has been described with respect to the specific embodiments for complete and clear disclosure, the appended claims are not be thus limited but are to be construed as embodying all modification and alternative constructions that may occur to one skilled in the art which fairly fall within the basic teaching herein set forth.

What is claimed is:

1. A plasma processing apparatus, comprising:
   a processing chamber in which an object to be processed is placed;
   means for supplying process gas into the processing chamber;
   means for generating microwaves to be used for exciting plasma in the processing chamber;
   a microwave introducing member having a transmission portion through which the microwaves pass into the processing chamber;

a conductive thin film provided on a surface of the microwave introducing member which is exposed to the processing chamber, the conductive thin film being provided with microwave transmission opening and being grounded to act as an electrode, and a high frequency power supply which applies high frequency voltage to the object, so that plasma is generated in the processing chamber with the microwaves supplied through the microwave introducing member.

2. The plasma processing apparatus according to claim 1, wherein, the conductive thin film is formed by a plasma sputtering technique.

3. The plasma processing apparatus according to claim 1, wherein, the conductive thin film comprises a material selected from SiC, Si, C and Al.

4. The plasma processing apparatus according to claim 1, wherein, the conductive thin film is formed to have a thickness of 10 $\mu$m to 100 $\mu$m.

5. A plasma processing apparatus, comprising:

a processing chamber in which an object to be processed is placed;

means for supplying process gas into the processing chamber;

means for generating microwaves to be used for exciting plasma in the processing chamber;

a microwave introducing member having a transmission portion through which the microwaves pass into the processing chamber;

an insulation thin film provided on a surface of the microwave introducing member which is exposed to the processing chamber;

a conductive thin film provided on a surface of the microwave introducing member, the conductive thin film being provided with microwave transmission openings and being grounded to act as an electrode, and a high frequency power supply which applies high frequency voltage to the object, so that plasma is generated in the processing chamber with the microwaves supplied through the microwave introducing member.

6. The plasma processing apparatus according to claim 5, wherein, the insulation thin film comprises an inorganic oxide material.

7. The plasma processing apparatus according to claim 5, wherein, the insulation thin film comprises an inorganic nitride material.

8. The plasma processing apparatus according to claim 5, wherein, the insulation thin film is formed to have a thickness of 10 $\mu$m to 100 $\mu$m.

9. The plasma processing apparatus according to claim 5, wherein, the conductive thin film is formed by a plasma sputtering technique.

10. The plasma processing apparatus according to claim 5, wherein, the conductive thin film comprises a material selected from SiC, Si, C and Al.

11. The plasma processing apparatus according to claim 5, wherein, the conductive thin film is formed to have a thickness of 10 $\mu$m to 100 $\mu$m.

12. The plasma processing apparatus according to claim 5, wherein, the insulation thin film is provided only at the transmission portion.

13. The plasma processing apparatus according to claim 5, wherein, the insulation thin film is provided in the microwave transmission openings and over the conductive thin film.

14. The plasma processing apparatus according to claim 13, wherein, the conductive thin film and the insulation thin film are formed by the steps of:

(1) providing the conductive thin film on the surface of the microwave introducing member; and (2) providing the insulation thin film over the entire surface of the microwave introducing member.

15. The plasma processing apparatus according to claim 13, wherein, the conductive thin film and the insulation thin film are formed by the steps of:

(1) providing the conductive thin film on the surface of the microwave introducing member; and (2) providing a first insulation thin film in the microwave transmission openings having the same thickness as the conductive thin film;

(3) providing a second insulation film on the conductive thin film.

16. A microwave-plasma etching apparatus, comprising:

reaction chamber in which a semiconductor wafer to be processed is placed;

means for supplying process gas into the reaction chamber;

a microwave oscillator which generates microwaves to be used for exciting plasma in the reaction chamber;

a microwave introducing window having a transmission portion through which the microwaves pass into the reaction chamber;

an insulation thin film provided on a surface of the microwave introducing window which is exposed to the reaction chamber, the insulation thin film being made of inorganic material;

a conductive thin film provided on the surface of the microwave introducing window, the conductive thin film being provided with microwave transmission openings and being formed by a plasma sputtering technique and being grounded to act as an electrode, and a high frequency power supply which applies high frequency voltage to the semiconductor wafer, so that plasma is generated in the reaction chamber with the microwaves supplied through the microwave introducing window.

17. plasma processing apparatus, comprising:

a processing chamber in which an object to be processed is placed;

means for supplying process gas into the processing chamber;

means for generating microwaves to be used for exciting plasma in the processing chamber;

a microwave introducing member having a transmission portion through which the microwaves pass into the processing chamber;

an insulation thin film provided on a surface of the microwave introducing member which is exposed to the processing chamber;

a conductive thin film provided on the insulation thin film, the conductive thin film being provided with microwave transmission openings and being grounded to act as an electrode; and a high frequency power supply which applies high frequency voltage to the object, so that plasma is generated in the processing chamber with microwaves supplied through the microwaves introducing member.

* * * * *

UNITED STATES PATENT AND TRADEMARK OFFICE
CERTIFICATE OF CORRECTION

PATENT NO. : 5,911,852
DATED : June 15, 1999
INVENTOR(S) : Katsuo Katayama, et. al.

It is certified that error appears in the above-identified patent and that said Letters Patent is hereby corrected as shown below:

Title page, item [73] Assignee: add --NEC Corporation--

Signed and Sealed this

Fourth Day of January, 2000

Attest:

*Attesting Officer*

*Acting Commissioner of Patents and Trademarks*

UNITED STATES PATENT AND TRADEMARK OFFICE
CERTIFICATE OF CORRECTION

PATENT NO.   : 5,911,852
DATED        : June 15, 1999
INVENTOR(S)  : Katsuo Katayama et al.

It is certified that error appears in the above-identified patent and that said Letters Patent is hereby corrected as shown below:

Title page,
Item [73], Assignee should read:

-- Sumitomo Metal Industries Limited of Osaka, Japan, and
NEC Corporation of Tokyo, Japan Signed and Sealed this Eighteenth Day of December, 2001

Attest:

Attesting Officer

JAMES E. ROGAN
Director of the United States Patent and Trademark Office